(12) United States Patent
Zhang et al.

(10) Patent No.: US 6,501,405 B1
(45) Date of Patent: Dec. 31, 2002

(54) METHOD AND APPARATUS FOR DIGITAL TO ANALOG CONVERSION WITH DISTORTION CALIBRATION

(75) Inventors: John Zhongxuan Zhang, Fremont, CA (US); Peter Gunadisastra, Palo Alto, CA (US); Dale Smith, Fremont, CA (US); Mong Yang, San Jose, CA (US); Ali Al-Shamma, San Jose, CA (US)

(73) Assignee: IKANOS Communication, Inc., Fremont, CA (US)

( * ) Notice: Subject to any disclaimer, the term of this patent is extended or adjusted under 35 U.S.C. 154(b) by 0 days.

(21) Appl. No.: 09/881,857

(22) Filed: Jun. 13, 2001

Related U.S. Application Data (60) Provisional application No. 60/211,714, filed on Jun. 13, 2000.

(51) Int. Cl.[7] .............................................. H03M 3/00
(52) U.S. Cl. ...................... 341/143; 341/118; 341/120; 341/144; 341/155
(58) Field of Search .................. 341/143, 155, 341/156, 144, 145, 126, 110, 118, 120

(56) References Cited

U.S. PATENT DOCUMENTS

| | | | | |
|---|---|---|---|---|
| 4,972,436 A | * | 11/1990 | Halim et al. | 375/28 |
| 5,012,245 A | * | 4/1991 | Scott et al. | 341/150 |
| 5,061,925 A | * | 10/1991 | Sooch et al. | 341/120 |
| 5,313,205 A | * | 5/1994 | Wilson | 341/144 |
| 5,583,501 A | * | 12/1996 | Henrion et al. | 341/118 |
| 5,909,463 A | * | 6/1999 | Johnson et al. | 375/220 |
| 6,124,815 A | * | 9/2000 | Lee et al. | 341/143 |
| 6,150,969 A | * | 11/2000 | Melanson | 341/143 |
| 6,229,466 B1 | * | 5/2001 | Gattani | 341/120 |
| 2001/0033650 A1 | * | 10/2001 | Wilson et al. | 379/398 |
| 2001/0036261 A1 | * | 11/2001 | Prendergast et al. | 379/398 |

\* cited by examiner

*Primary Examiner*—Michael Tokar
*Assistant Examiner*—John Nguyen
(74) *Attorney, Agent, or Firm*—IP Creators; Charles C. Cary (57) ABSTRACT

An apparatus and method is disclosed for minimizing in band distortion in the transmit path of an XDSL modem. The transmit path of an XDSL modem introduces various non-linearities into transmissions in both the frequency and time domains. The current invention provides a means for both determining and correcting for distortion in the time domain. In an embodiment of the invention the apparatus may include a calibrator which may be implemented using the existing analog-to-digital (ADC) conversion and demodulation capabilities on the receive path of the modem or alternately, a dedicated module. During a calibration phase a training signal is injected digitally into the digital-to-analog converter of the transmit path. The analog portion of the transmit path is coupled to a calibrator which measures the corresponding analog response. The correlation between input and response is stored in an analog model. During subsequent training and run-time phases of modem operation an oversampled digital input stream is subject to digital Delta Sigma Modulation ($\Delta\Sigma M$) with the analog model injected into the feedback path from the quantizer. The injection of the analog model into the feedback improves the noise transfer function (NTF) associated with the $\Delta\Sigma M$.

19 Claims, 6 Drawing Sheets

METHOD AND APPARATUS FOR DIGITAL TO ANALOG CONVERSION WITH DISTORTION CALIBRATION

CROSS REFERENCE TO RELATED APPLICATION

This application claims the benefit of prior filed co-pending Provisional Application No. 60/211,714 filed on Jun. 13, 2000 entitled "Multi-bit Oversampling D to A Converter with self digital Correction/Calibration" which is incorporated herein by reference in their entirety as if fully set forth herein.

BACKGROUND OF THE INVENTION

1. Field of Invention

The field of the present invention relates in general to communication systems and more particularly to digital to analog conversion systems for the transmit path of an XDSL modem.

2. Description of the Related Art

Digital Subscriber Lines (DSL) technology and improvements thereon including: G.Lite, ADSL, VDSL, HDSL all of which are broadly identified as X-DSL have been developed to increase the effective bandwidth of existing subscriber line connections. An X-DSL modem operates at frequencies higher than the voice band frequencies, thus an X-DSL modem may operate simultaneously with a voice band modem or a telephone conversation. Currently there are over ten discrete X-DSL standards, including: G.Lite, ADSL, VDSL, SDSL, MDSL, RADSL, HDSL, etc.

One of the factors limiting the bandwidth or channel capacity of any of the above discussed X-DSL protocols is distortion. The components on the transmit path of a modem inherently distort signals as they transmit them. Amplitude modulation causes distortion to become dependent on the input signal with a result of the amplified output signal is no longer simply an amplified replica of the input signal. Unfortunately if linear modulation with a fluctuating envelope is used in conjunction with nonlinear amplification, spectral spreading may occur thereby interfering with communications.

What is needed are approaches to reducing in band distortion for X-DSL modems.

SUMMARY OF THE INVENTION

An apparatus and method is disclosed for minimizing in band distortion in the transmit path of an XDSL modem. The transmit path of an XDSL modem introduces various non-linearities into transmissions in both the frequency and time domains. The current invention provides a means for both determining and correcting for distortion in the time domain. Distortion in the time domain may result from digital to analog conversion or analog filtering for example. The apparatus may be incorporated in an existing X-DSL architecture without additional circuitry. The apparatus may be applied with equal advantage in wired and wireless media.

In an embodiment of the invention the apparatus may include a calibrator which may be implemented using the existing analog-to-digital (ADC) conversion and demodulation capabilities on the receive path of the modem or alternately, a dedicated module. During a calibration phase a training signal is injected digitally into the digital-to-analog converter of the transmit path. The analog portion of the transmit path is coupled to a calibrator which measures the corresponding analog response. The correlation between input and response is stored in an analog model.

During subsequent training and run-time phases of modem operation an oversampled digital input stream is subject to digital Delta Sigma Modulation (ΔΣM) with the analog model injected into the feedback path from the quantizer. The injection of the analog model into the feedback improves the noise transfer function (NTF) associated with the ΔΣM.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

The current invention provides a method and apparatus for minimizing in band distortion in the transmit path of an XDSL modem. An analog model is generated for the analog portion of the transmit path. The analog model correlates a digital input with the corresponding analog output. During modem operation an oversampled digital input stream is subject to digital Delta Sigma Modulation (ΔΣM) with the analog model injected into the feedback path from the quantizer. The injection of the analog model into the feedback improves the noise transfer function (NTF) associated with the ΔΣM. The NTF provides an estimate of the manner in which the quantization noise is spread out in the frequency domain. Ideally the NTF frequency response is negligible over the bandwidth of the transmit signal, with the bulk of the noise shifted to higher frequencies above the transmit bandwidth where it can be filtered out. By injecting the analog model into the feedback path of the ΔΣM the amount of noise in the transmit bandwidth is reduced.

Figure 1:
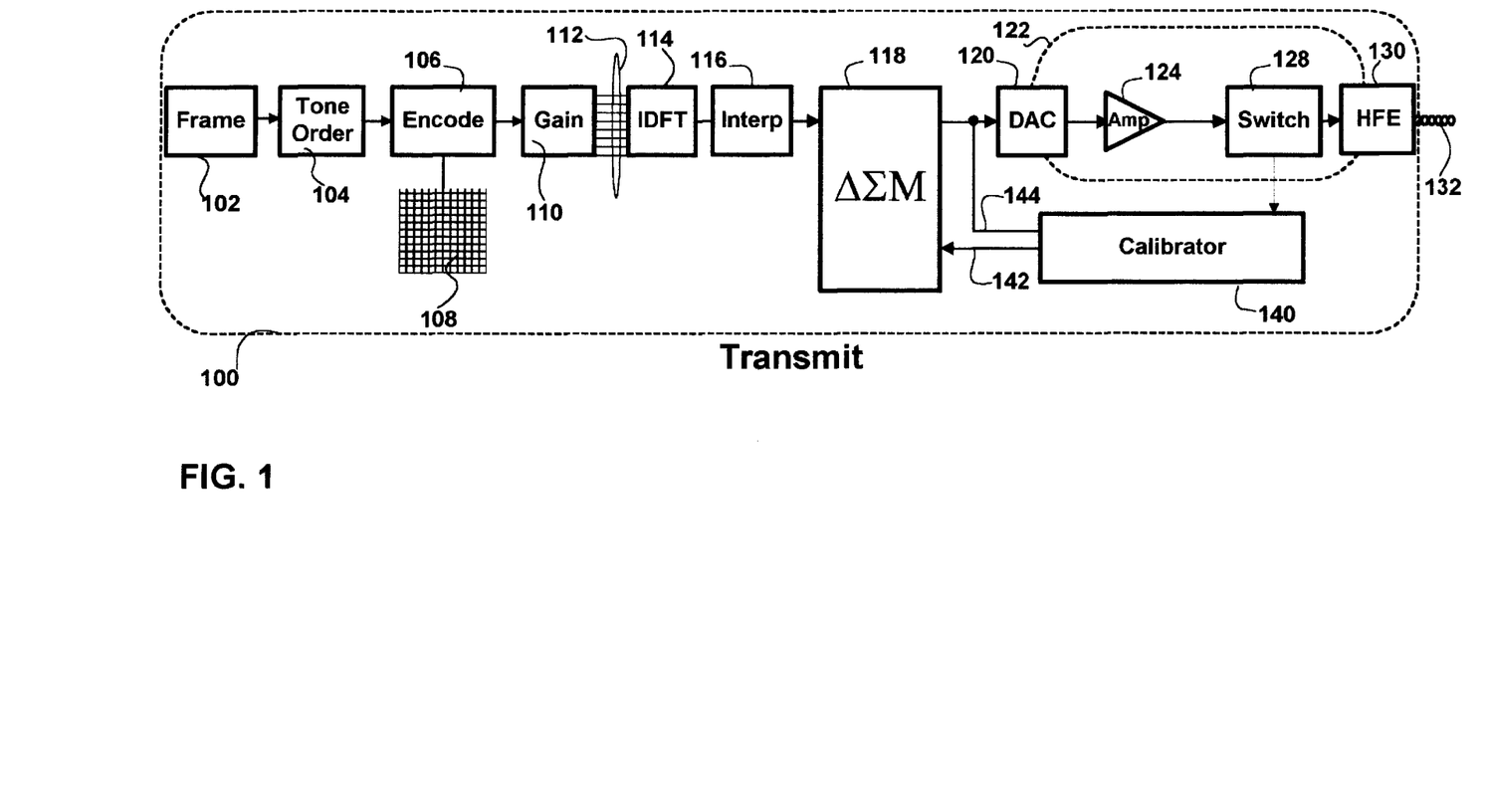
FIG. 1 is a hardware block diagram showing the transmit path of an XDSL modem incorporating both the distortion calibration and compensation capabilities.

FIG. 1 is a hardware block diagram showing the transmit path of an XDSL modem incorporating both the distortion calibration and compensation capabilities. The transmit path 100 includes: a framer 102, a tone orderer 104, an encoder 106, a gain scaler 110, an inverse discrete Fourier transform engine (IDFT) 114, an interpolator 116, a ΔΣM 118, a digital-to-analog converter (DAC) 120, amplifier 124, a switch 128 and a hybrid front end (HFE) 130 coupled to subscriber line 132. In an embodiment of the invention a calibrator 140 is also included. The DAC, amplifier, switch and HFE comprise the analog portion 122 of the transmit path.

The framer sets frame boundaries on an incoming digital bit stream. Where the modulation protocol is digital multi-tone (DMT) the tone orderer 104 allocates the incoming bits of each frame to corresponding tones. In alternate embodiments of the invention alternate modulation protocols such as carrierless amplitude modulation and phase modulation AMIPM (CAP) may be implemented. The encoder 106 accepts sets of real number inputs and converts them using a symbol map 108 to a complex number output with one complex number output for each tone bin 112 of the IDFT engine 114. The IDFT converts a digital symbol from the frequency to the time domain and the digital samples resulting there from are passed to the interpolator. In the interpolator the number of digital symbols is increased. This process provides an oversampled input to the ΔΣM 118. Within the ΔΣM each of the oversampled digital input samples is quantized with an analog model incorporated into the feedback loop of the ΔΣM. The combination of over-sampling followed by delta sigma modulation reduces the complexity of the digital to analog converter (DAC) 120 and the coupling of an analog model into the feedback loop of the ΔΣM improves the overall NTF for the modem transmit path.

The DAC performs the digital-to-analog conversion. The DAC output may be subject to further analog processing such as amplification by amplifier 124. A switch 128 is provided to couple the later portions of the analog transmit path with the calibrator 140 during the calibration phase. At all times the analog path remains coupled through the HFE 130 to the subscriber line 132.

During the calibration phase of the modems operation the calibrator injects a training signal into the digital input of the DAC on line 144 and digitally samples the resultant analog on the analog portion 122 of the transmit path via switch 128. The calibrator continues this process until an analog model table is generated correlating each digital input with a corresponding digitized version of the analog output resulting there from. This analog model is then passed to the ΔΣM where it is injected into the feedback from the quantizer to improve the overall NTF for the modem transmit path.

In an alternate embodiment of the invention calibration can be performed multiple times with the analog model table formed from a mean or average of the results.

Figure 2:
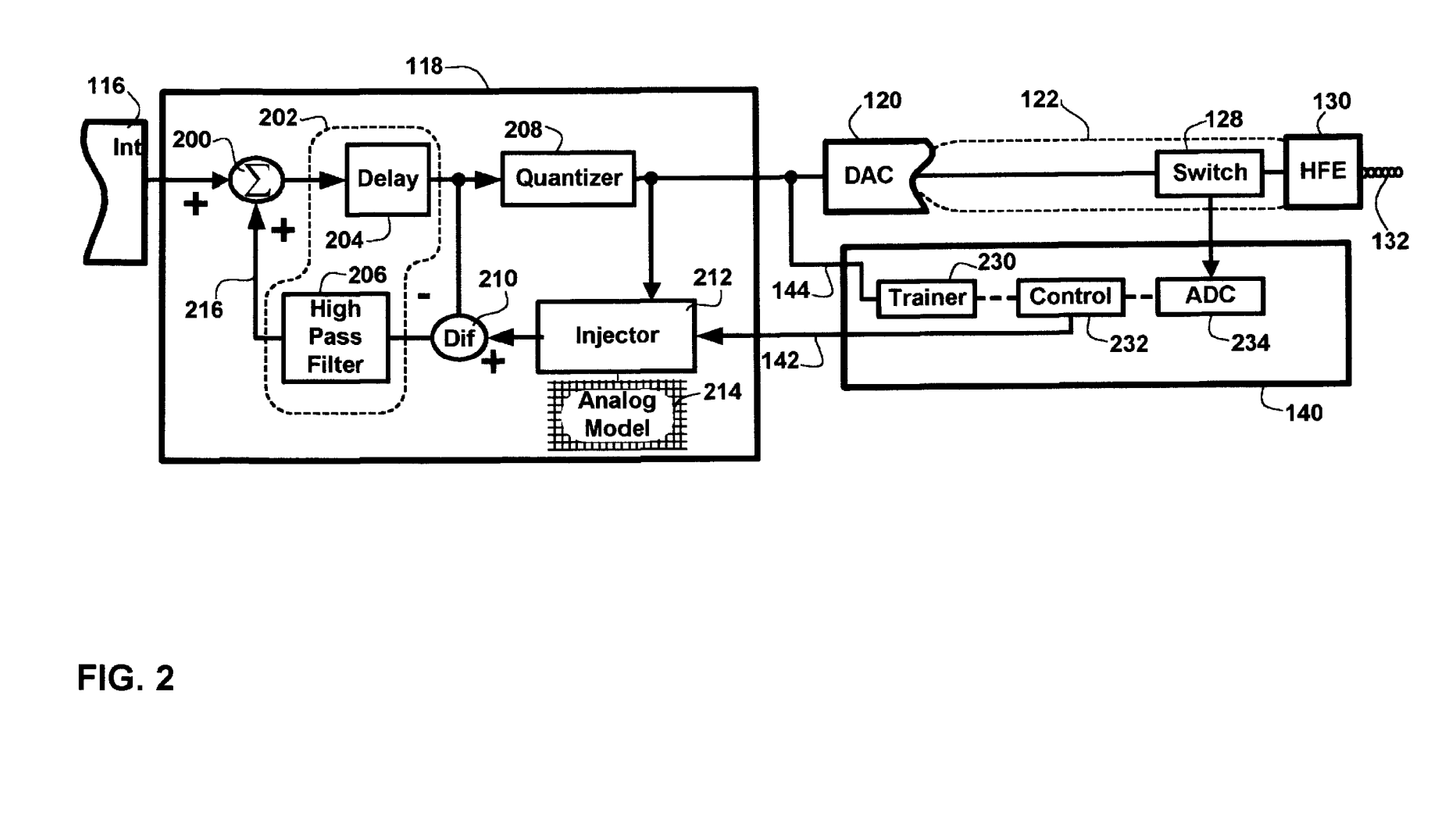
FIG. 2 is an exploded hardware block diagram of the delta sigma modulator and calibrator modules which are part of the transmit path shown in FIG. 1.

FIG. 2 is an exploded hardware block diagram of the delta sigma modulator 118 and calibrator 140 modules which are part of the transmit path shown in FIG. 1. The ΔΣM includes a summer 200, a filter 202, a quantizer 208, a differencer 210, and an injector 212. The filter includes a delay block 204 and a high pass filter 206. The calibrator includes: an analog-to-digital (ADC) converter 234, a control 232, and a trainer 230.

In an embodiment of the invention, during the calibration phase of the modem, the trainer injects a training signal into the digital input of the DAC on line 144. The ADC 234 digitally samples the resultant analog signal on the analog portion 122 of the transmit path via switch 128. The controller 232 continues this process until it has generated the analog model table there from. The analog model table correlates each digital input with a corresponding digitized version of the analog output resulting there from. This analog model is then passed by the controller to the ΔΣM. The analog model table 214 is stored in the ΔΣM by the injector 212. The ΔΣM generally accepts each digital sample at summer 200 where it is summed with a feedback signal 216 from filter 202, to form a composite sample at the output of the summer. The composite sample is introduced to the filter 202. In the embodiment of the invention shown the filter 202 includes a delay block 204 and a high pass filter 206. The arrangement of these components 204,206 is one several that will perform the filter function 202 of the ΔΣM. The composite sample is passed both to the quantizer 208 and to the differencer 210. In the quantizer the composite sample is quantized to a coarser resolution. The quantized composite sample is passed to the DAC 120 and to the injector 212. The injector looks up the quantized composite sample value in the analog model table and injects into the differencer 210 the corresponding digitized analog output value. The differencer determines the error between the composite sample value on one input and the distortion to that value effected by quantization and analog modeling. The error signal output of the differencer is provided to the filter 202. In this embodiment of the invention the error signal is high pass filtered in high pass filter 206 to form the feedback signal which is provided to one of the two inputs of the summer 200. In an alternate embodiment of the invention the filter 206 may be a band pass filter. This process is digitally repeated for each successive oversampled digital input from the interpolator 116. During subsequent training and run time phases of the modems operation the switch 128 uncouples the calibrator from the transmit path.

In alternate embodiments of the invention the analog model table may be designed into the ΔΣM 118 based on the theoretical design predictions for modem performance. Alternately, the analog model table may be uploaded from calibration equipment (not shown) after production and/or laboratory testing of the modem. In these embodiments of the invention the calibrator is not required.

In alternate embodiments of the ΔΣM 118 (See FIGS. 1–2) may be achieved with alternate arrangements of the various components shown therein without departing from the scope of the invention. For example, the delay block 204 and the high pass filter 206 may be substituted for each other.

Figure 3:
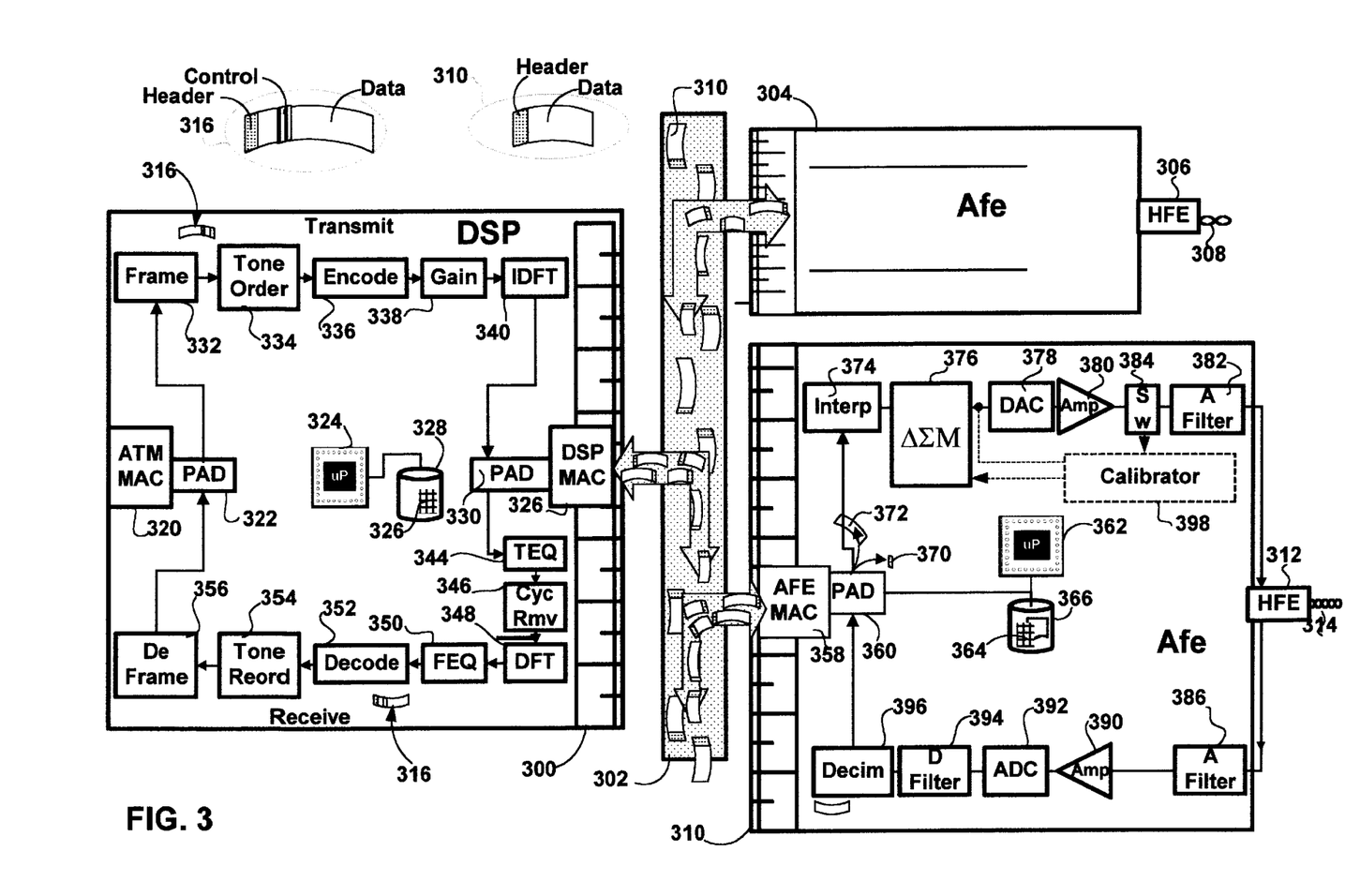
FIG. 3 is a detailed hardware block diagram of a packet based multi-channel multi-protocol XDSL logical modem which may be used to implement the current invention.

FIG. 3 is a detailed hardware block diagram of a packet based multi-channel multi-protocol XDSL logical modem which may be used to implement the current invention. In this architecture a DSP 300 handles processing for a number of channels of upstream and downstream subscriber line communications via a number of analog front ends (AFE's) 304 and 310. Each AFE in turn accepts packets associated with one or more of subscriber lines to which each AFE is coupled. AFE 304 is shown coupled via HFE 306 with subscriber line 308. AFE 310 is shown coupled via HFE 312 with subscriber line 314. The logical modem shown in FIG. 3 supports packet based processing of data between a DSP and AFE as well as within each DSP and AFE. Packet processing between DSP and AFE modules involves transfer over bus 302 of bus packets 310 each with a header and data portion. The header contains information correlating the data with a specific channel and direction, e.g. upstream or downstream, of communication. The data portion contains for upstream traffic digitized samples of the received data for each channel and for downstream packets digitized symbols for the data to be transmitted on each channel.

Packet processing within a DSP may involve device packets 316. The device packets may include a header, a control portion and a data portion. The header serves to identify the specific channel and direction. The header may contain control information for the channel to be processed. The control portion may also contain control parameters for each specific component along the transmit or receive path to coordinate the processing of the packets. Within the AFE the digitized data generated for the received (upstream data) will be packetized and transmitted to the DSP. For downstream data, the AFE will receive in each packet from the DSP the digitized symbols for each channel which will be modulated in the AFE and transmitted over the corresponding subscriber line. These modules, AFE and DSP, may be found on a single universal line card. They may alternately be displaced from one another on separate line cards linked by a DSP bus. In still another embodiment they may be found displaced across an ATM network.

The DSP 300 includes, a DSP medium access control (MAC) 326 which handles packet transfers to and from the DSP bus 302. The MAC couples with a packet assembler/disassembler (PAD) 330. For received DSP bus packets, the PAD handles removal of the DSP bus packet header and insertion of the device header and control header which is part of the device packet 316. The content of these headers is generated by the core processor 324 using statistics gathered by the de-framer 356. These statistics may include gain tables, or embedded operations channel communications from the subscriber side. The PAD embeds the required commands generated by the core processor in the header or control portions of the device packet header. Upstream device packets (Receive packets) labeled with the appropriate channel identifier are passed through the time domain equalizer (TEQ) 344 and the cyclic prefix/suffix remover 346 to the discrete Fourier transform (DFT) engine 348. The DFT engine fetches packets and processes the data in them in a manner appropriate for the protocol, channel and command instructions, if any, indicated by the header. The processed data is then passed to the frequency domain equalizer (FEQ) 350, the decoder 352, the tone reorderer 354 and the deframer 356. Each module reads the next device packet and processes the data in it in accordance with the instructions or parameters in its header. The processed de-framed data is passed to the ATM pad 322 for wrapping with an ATM header and removal of the device header. The ATM MAC 320 then places the data with an ATM packet on the ATM or other network.

Control of the receive modules, e.g. DFT engine 348, FEQ 350, etc. is implemented as follows. The core processor 324 gathers statistical information on each channel including gain tables, or gain table change requests from the subscriber as well as instructions in the embedded operations portion of the channel. Those tables 326 are stored by the core processor in memory 328. When a change in gain table for a particular channel is called for the core processor sends instructions regarding the change in the header of the device packet for that channel via PAD 330 and writes the new gain table to a memory which can be accessed by the appropriate module in the receive path. This technique of in band signaling with packet headers allows independent scheduling of actions on a channel by channel basis in a manner which does not require the direct control of the core processor. Instead each module in the receive path can execute independently of the other at the appropriate time whatever actions are required of it as dictated by the information in the device header which it reads and executes.

This device architecture allows the DSP transmit and receive paths to be fabricated as independent modules or sub modules which respond to packet header control information for processing of successive packets with different XDSL protocols, e.g. a packet with ADSL sample data followed by a packet with VDSL sampled data. For example as successive packets from channels implementing G.Lite, ADSL and VDSL pass through the DFT 348 the number of tones will vary from G.lite, ADSL and for VDSL. The framer 332 and de-framer 356 will use protocol specific information associated with each of these channels to look for different frame and super frame boundaries. The measured level of each tone is maintained by processor 324 in memory 328. This same memory may be utilized for calculating the inverse channel model for each of the channels to determine the amount of pre-compensation to be applied to downstream data on each of the channels.

On the downstream side (Transmit path) the same architecture applies. ATM data is wrapped by PAD 322 with a device header the contents of which are again dictated by the core processor 324. That processor embeds control information related to each channel in the packets corresponding to that channel. The Framer 332, tone orderer 334, encoder 336, gain scaler 338 and inverse discrete Fourier transform (IDFT) engine 340 process these packets according to the information contained in their header or control portions of each device packet. From the IDFT 340 each updated device packet with a digitized symbol(s) for a corresponding channel is sent to PAD 330 where the device header is removed. The DSP PAD places the DSP packet 310 with an appropriate header to DSP MAC 326 for placement onto the DSP bus 302 for transmission to the appropriate AFE and the appropriate channel and subscriber line within the AFE.

Because the data flow in the AFE allows a more linear treatment of each channel of information an out of band control process is utilized within the AFE. In contrast to the DSP device packets which are used to coordinate various independent modules within the DSP the AFE accomplishes channel and protocol changeovers with a slightly different control method.

A packet on the bus 302 directed to AFE 310 is detected by AFE MAC 358 on the basis of information contained in the packet header. The packet is passed to PAD 360 which removes the header 370 and sends it to the core processor 362. The packet's header information including channel ID is stored in the core processor's memory 366. The information is contained in a table 364. The raw data 372 is passed to interpolator 374. On the transmit path, the interpolator 374 reads a fixed amount of data from each channel. The amount of data read varies for each channel depending on the bandwidth of the channel. The amount of data read during each bus interval is governed by entries in the control table for each channel which is established during channel setup and is stored in memory 366. The interpolator up samples the data and passes it to $\Delta\Sigma$M 376. Implementing interpolation in the AFE as opposed to the DSP has the advantage of lowering the bandwidth requirements of the DSP bus 302. Within the $\Delta\Sigma$M each of the oversampled digital input samples is quantized with an analog model incorporated into the feedback loop of the $\Delta\Sigma$M. The combination of oversampling followed by delta sigma modulation reduces the complexity of the digital to analog converter (DAC) 378 and the coupling of an analog model into the feedback loop of the $\Delta\Sigma$M improves the overall NTF for the modem transmit path. From the $\Delta\Sigma$M data is passed to the digital-to-analog converter (DAC) 378. The DAC converts the digitized symbol for each of the input signals on each of the input signal lines/channels to corresponding analog signals. These analog signals are introduced to the amplification stage 380, from which they are passed to analog filter 382 and then via an associated HFE, e.g. HFE 312 to a corresponding subscriber line e.g. subscriber line 314.

A switch 384 is present in the final stages of the analog portion of the transmit path. That switch during the calibration phase couples the transmit path to a slow speed high precision ADC within calibrator 398. The calibrator injects a digital training sequence into the DAC and the resultant analog signal transmitted on the transmit path is converted to corresponding digital samples by the ADC within calibrator 398. In an embodiment of the invention the digital training sequence is a set of digital values which generate a staircase of digital values of increasing magnitude across the range acceptable to the DAC. The calibrator passes the resultant analog model lookup table to the ΔΣM where it is used improve the noise shaping effected by the ΔΣM. In alternate embodiments of the invention the ΔΣM may include an analog model table defined during production of the modem using either design estimates of the analog transmission path distortion or actual measurements performed on the modem with external instrumentation. In these latter embodiments of the invention the calibrator would not be required.

In an alternate embodiment of the invention the switch 384 may during the calibration phase couple the analog portion of the transmit path to the receive path. The components on the receive path, i.e. ADC 392 and processor 362 may then be used to generate the analog transmit path model table.

On the upstream path, the receive path, individual subscriber lines couple to the receive path. Subscriber line 314 couples through HFE 312 to the analog filer 386. The analog filter provides input to the corresponding line amplifier 390. From the line amplifier the received analog data is digitized in the analog to digital converter (ADC) 392. The digitized output is passed through the digital filter 394 and decimator 396 to the pad 360. The PAD wraps the raw data in a DSP header with channel ID and other information which allows the receiving DSP to properly process it. From the PAD it is passed to the AFE MAC 358 for wrapping in a bus packet 310 and delivery to the DSP 300.

Figure 4:
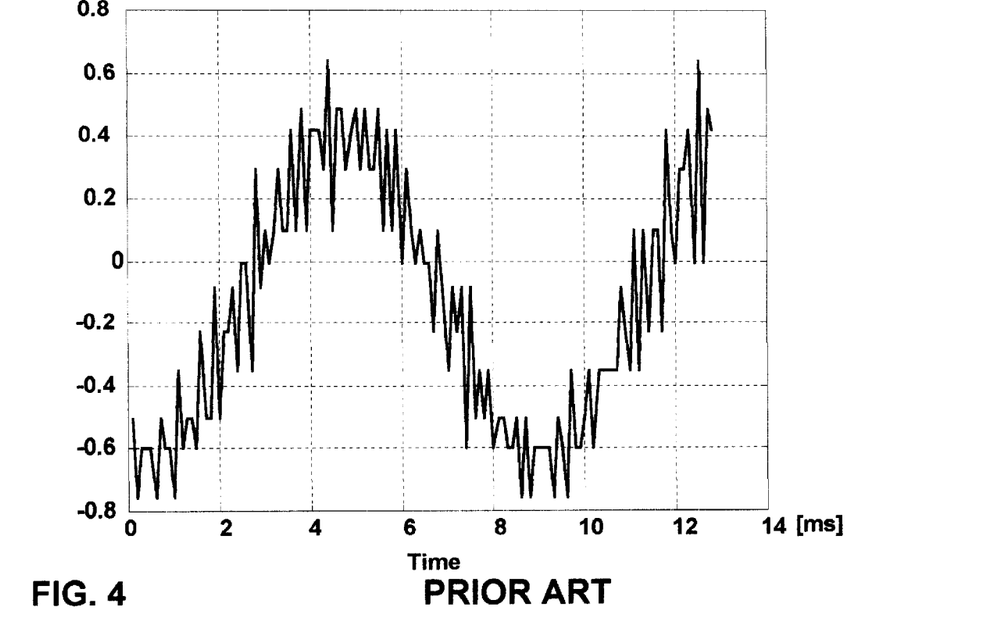
FIGS. 4–5 are graphs showing the delta sigma modulation in the time domain for a sinusoidal digital input stream without (Prior Art) and with respectively injection of the analog model into the feedback loop of the delta sigma modulator.
Figure 5:
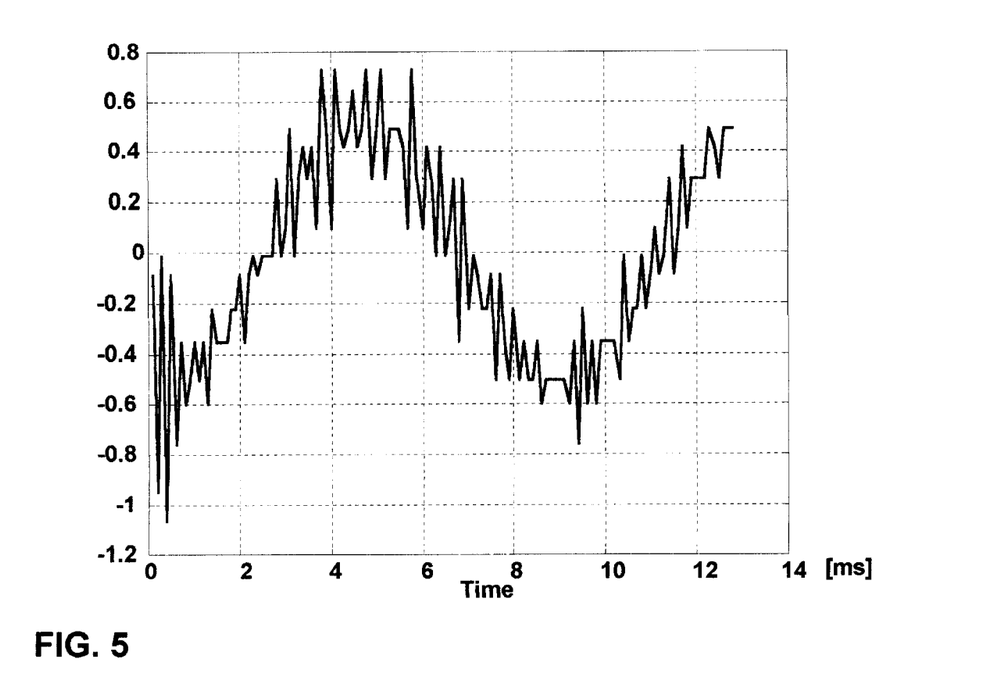

FIGS. 4–5 are graphs showing the delta sigma modulation in the time domain for a 814 kHz sinusoidal digital input stream without (Prior Art) and with respectively injection of the analog model into the feedback loop of the delta sigma modulator. The signal in FIG. 5 corresponds to that at switch 128 shown in FIG. 1.

Figure 6:
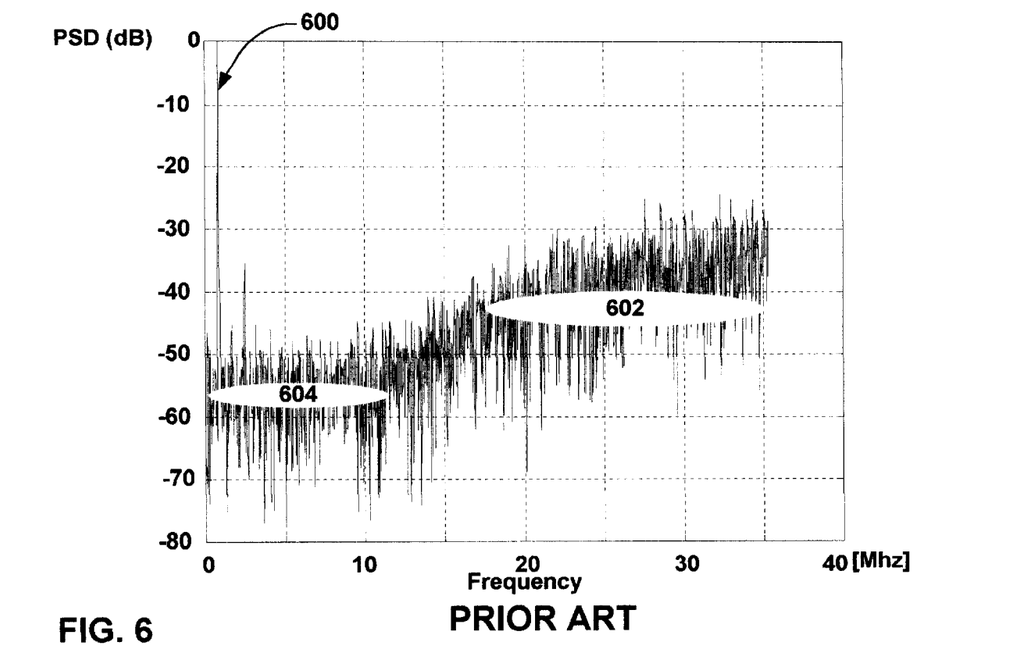
FIGS. 6–7 are graphs showing the transmit power spectrum in the frequency domain for a sinusoidal digital input stream without (Prior Art) and with respectively injection of the analog model into the feedback loop of the delta sigma modulator.
Figure 7:
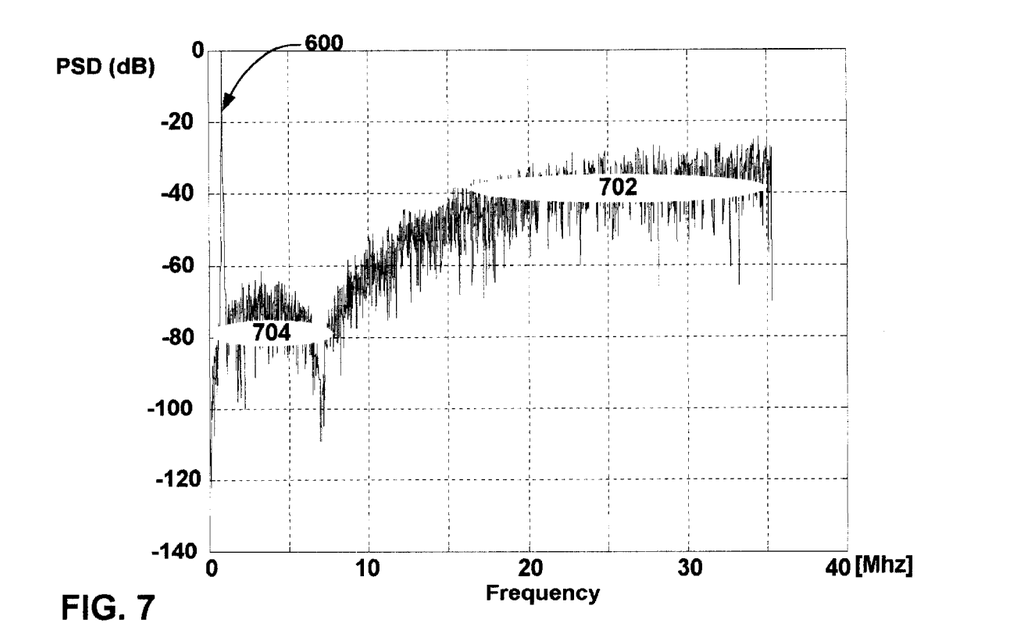

FIGS. 6–7 are graphs showing the transmit power spectrum in the frequency domain for a 814 kHz sinusoidal digital input stream 600 without (Prior Art) and with respectively injection of the analog model into the feedback loop of the delta sigma modulator. The signal in FIG. 7 corresponds to that at switch 128 shown in FIG. 1.

In FIG. 6, the Prior Art ΔΣM case, the power spectral density (PSD) in the transmit band 604 and at frequencies outside the transmit band 602 are shown. The frequency distribution of noise in the transmit bandwidth 604 for the prior art ΔΣM is in the range of −55 dB.

In FIG. 7, the ΔΣM of the current invention with analog model injection in the feedback loop results in reduced power spectral density (PSD) in the transmit band 704 and an increase in PSD at frequencies outside the transmit band 702. The frequency distribution of noise in the transmit bandwidth 704 is in the range of −80 dB or a roughly 30 dB lower noise floor than can be attained without injection of the analog model into the feedback loop of the ΔΣM. The lowering of the noise floor in the transmit range of the modem is brought about by the ΔΣM accepting the oversampled output stream from the interpolator and modulating the samples with a noise shaping transform where the shaping includes both quantization together with simulated analog distortion of the quantization. The simulated analog distortion of the quantizatation is effected by the injector and analog model table. The ΔΣM accepts original and interpolated digital samples from the interpolator and modulates the oversampled input stream from the interpolator with a noise shaping transform. The noise in the noise shaping transform includes both a quantization component and a distortion component. The quantization component is introduced by the quantizer 208 (See FIG. 1). The distortion component is introduced by the injector 212 (See FIG. 1). The injector maps each input from the quantizer into a corresponding distorted value using the analog model table. The distorted value corresponds with the distortion of each quantizer output across the DAC input range brought about by the subsequent transmission of each quantized value through the analog portion 122 of the transmit path (See FIG. 1).

Figure 8:
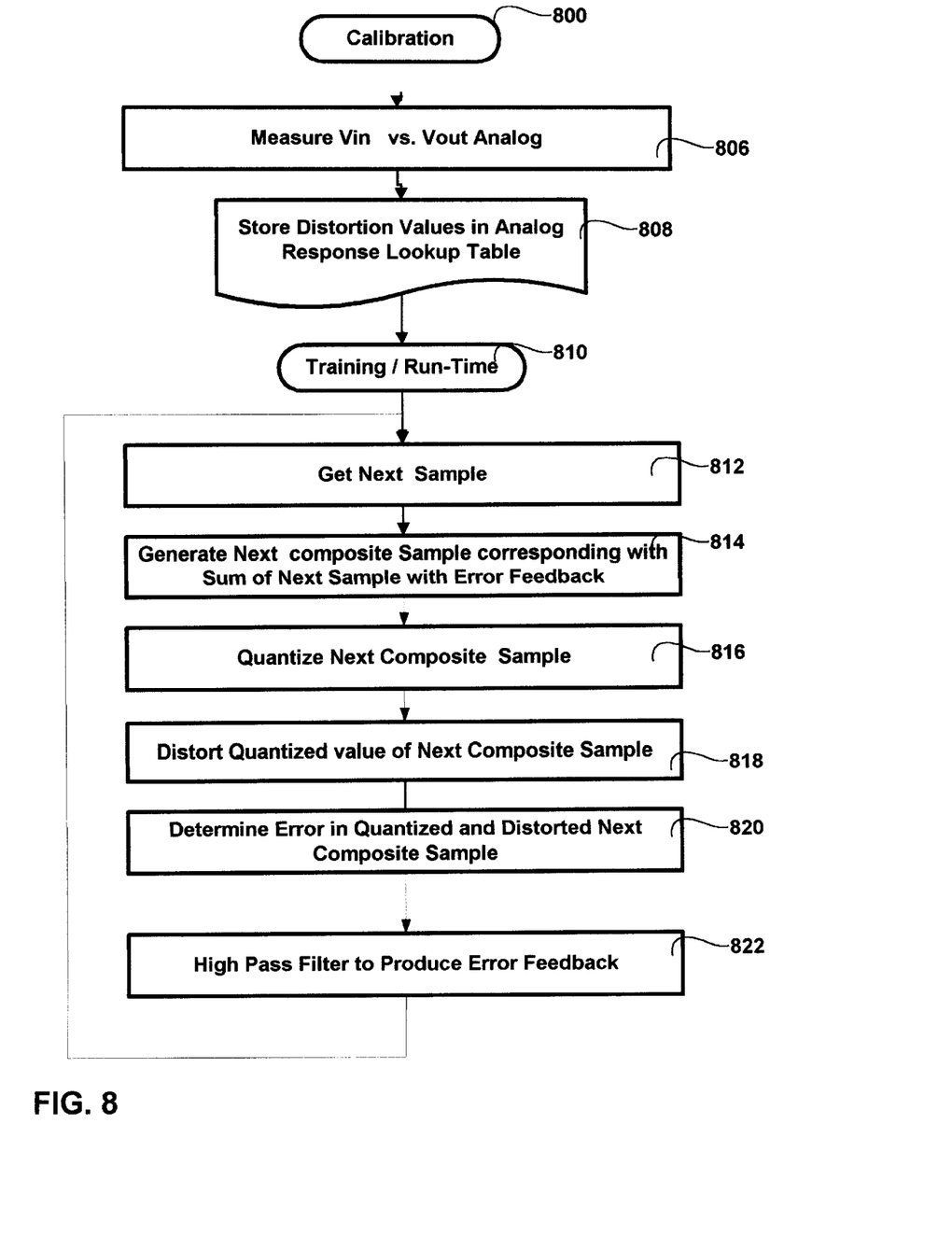
FIG. 8 is a process flow diagram of the processes effected by the calibrator and delta sigma modulator of the current invention.

FIG. 8 is a process flow diagram of the processes effected by the calibrator and delta sigma modulator of the current invention. After system initialization in block 800 calibration phase processing begins in process 806. In process 806 a training signal is injected by the calibrator into the DAC 120 (See FIGS. 1–2). The training signal may for example be a staircase set of digital values corresponding to the input voltage range of the DAC. The corresponding analog values are obtained via the switch 128 (See FIGS. 1–2). The staircase function and the resultant analog signal may have a very low frequency. This allows a relatively inexpensive low frequency high-resolution analog to digital converter to be used to sample the analog portion 122 (See FIGS. 1–2) of the transmit path. During training the transmit path remains coupled to the HFE 130 (See FIGS. 1–2) as well so as to properly model the performance of the transmit path under load. Each input value to the DAC and the corresponding digitized sample from the analog portion of the transmit path form a row entry in the analog model table generated by the calibrator during the calibration phase. These entries define the analog distortion of the transmit path. In process 808 the analog model table is passed to the injector of the ΔΣM 118 (See FIGS. 1–2). Control the passes to block 810. Block 810 marks the onset of the training and/or run-time phase of the modem. During both of these phases digitized samples from the interpolator 116 are passed to the ΔΣM 118 (See FIGS. 1–2) for processing in the following manner. In process 812 the next sample from the interpolator 116 (See FIGS. 1–2) is obtained. Then in process 814 a composite sample is generated by summing the sample with a feedback signal in the summer 200 (See FIGS. 102). Control than passes to processing 816. In process 816 the composite sample is quantized in quantizer 208 (See FIG. 2). The output of the quantizer is passed both to the DAC 120 (See FIGS. 1–2) as well as to the injector 212 (See FIG. 2). Next in process 818 the injector determines for each quantized value the corresponding value in the analog model table 214 (See FIG. 2) to which it is coupled. The injector outputs the corresponding value corresponding with the analog distortion and quantization of the composite sample to one of the two inputs of the differencer 210 (See FIG. 2). Then in process 820 the differencer determines the error between composite sample value and the quantization and analog distortion of that value brought about by the above discussed quantizer and injector. The error signal is then passed through high pass filter 206 in process 822 and presented to one of the two inputs of the summer 200 (See FIGS. 1–2). Control then returns to process 812 for the obtaining of the next sample from the interpolator. The processing continues in this fashion with each successive sample.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. An apparatus for conversion of a stream of digital input samples in a transmit path of an XDSL modem with both the transmit path and a receive path configured to couple to a communication medium, and the apparatus comprising on the transmit path;
   an interpolator to interpolate the stream of digital input samples and to provide an oversampled output stream therefrom;
   a delta sigma modulator ($\Delta\Sigma M$) having a summation element coupled at a first input terminal to an interpolator to receive the oversampled output stream therefrom, a quantizer to quantize summed values formed by the summation element and an injector coupled on a feedback path between the quantizer and a second input terminal of the summation element, and the injector for injecting into the feedback path digital values which correspond with distortions in an analog portion of the transmit path; and
   a digital-to-analog (DAC) converter with an input coupled to the quantizer of the $\Delta\Sigma M$ and with an output coupled to the analog portion of the transmit path.

2. The apparatus of claim 1, further comprising:
   an analog model table coupled to the injector which correlates quantized values from the quantizer of the $\Delta\Sigma M$ with corresponding distortions thereof effected by the analog portion of the transmit path.

3. The apparatus of claim 2, with values of the analog model table derived from at least one of: a theoretical and an actual modeling of the analog portion of the transmit path.

4. The apparatus of claim 1, further comprising:
   a differencer coupled with the summation element and the injector to supply an error signal corresponding to a difference between the corresponding outputs from the injector and the summation element to the second input of the summation element.

5. The apparatus of claim 1, further comprising:
   a calibrator to calibrate the distortions in the analog portion of the transmit path during a calibration phase of the XDSL modem and to pass an analog model lookup table corresponding thereto to the injector for injection into the feedback path of the $\Delta\Sigma M$ during a run-time phase of the XDSL modem.

6. The apparatus of claim 5, wherein the calibrator further comprises:
   an analog-to-digital converter (ADC) switchably coupled to the analog portion of the transmit path during the calibration phase of the XDSL modem to provide digital samples therefrom,
   a trainer to inject a training signal into the input of the DAC during the calibration phase of the XDSL modem; and
   a control element coupled to the injector, the ADC and the trainer to generate the analog model lookup table which correlates the training signal with the corresponding digital samples derived therefrom.

7. The apparatus of claim 6, wherein the ADC comprises a portion of the receive path of the modem during a run-time phase of the XDSL modem.

8. A method for conversion of a stream of digital input samples in a transmit path of an XDSL modem with both the transmit path and a receive path configured to couple to a communication medium, and the method comprising:
   providing an oversampled output from the stream of digital input samples;
   delta sigma modulating the oversampled output provided in the providing act to provide a quantized output stream;
   injecting into a feedback path in the delta sigma modulating act digital values which correspond with distortions in an analog portion of the transmit path; and
   digital-to-analog (D/A) converting the quantized output stream from the delta sigma modulating act.

9. The method of claim 8, wherein the injecting act further comprises:
   correlating each quantized value in the quantized output stream with a corresponding distortion thereof effected by the analog portion of the transmit path.

10. The method of claim 9, where the correlating performed in the correlating act derives from at least one of: a theoretical and an actual modeling of the analog portion of the transmit path.

11. The method of claim 8, wherein the delta sigma modulating act further comprises:
    summing the oversampled output from the providing act with an error signal and with the error signal corresponding to a difference between digital values injected in the injecting act and sums generated in the summing act.

12. The method of claim 8, further comprising the acts performed prior to the providing act of:
    calibrating distortions in the analog portion of the transmit path during a calibration phase of the XDSL modem to determine the digital values injected in the injecting act.

13. The method of claim 12, wherein the calibrating act further comprises:
    injecting a training signal into the analog portion of transmit path;
    providing digital samples of the training signal from the analog portion of the transmit path; and
    generating an analog model lookup table which correlates the training signal with the corresponding digital samples derived therefrom in the providing act.

14. A means for conversion of a stream of digital input samples in a transmit path of an XDSL modem with both the transmit path and a receive path configured to couple to a communication medium, and the means comprising:
    means for providing an oversampled output from the stream of digital input samples;
    means for delta sigma modulating the oversampled output provided by the means for providing to provide a quantized output stream;
    means for injecting into a feedback path of the means for delta sigma modulating digital values which correspond with distortions in an analog portion of the transmit path; and
    means for digital-to-analog (D/A) converting the quantized output stream from the means for delta sigma modulating.

15. The means for conversion of claim 14, wherein the injecting act further comprises:
    means for correlating each quantized value in the quantized output stream with a corresponding distortion thereof effected by the analog portion of the transmit path.

16. The means for conversion of claim 15, where the correlating performed by the means for correlating derives from at least one of: a theoretical and an actual modeling of the analog portion of the transmit path.

17. The means for conversion of claim 14, wherein the means for delta sigma modulating further comprises:

means for summing the oversampled output from the means for providing with an error signal and with the error signal corresponding to a difference between digital values injected by the means for injecting and sums generated in the means for summing.

18. The means for conversion of claim 14, further comprising:

means for calibrating distortions in the analog portion of the transmit path during a calibration phase of the XDSL modem to determine the digital values injected by the means for injecting.

19. The means for conversion of claim 18, wherein the means for calibrating further comprises:

means for injecting a training signal into the analog portion of transmit path;

means for providing digital samples of the training signal from the analog portion of the transmit path; and means for generating an analog model lookup table which correlates the training signal with the corresponding digital samples derived therefrom in the means for providing.

* * * * *